(12) United States Patent
Getin et al.

(10) Patent No.: US 8,416,283 B2
(45) Date of Patent: Apr. 9, 2013

(54) 3D IMAGING DEVICE AND METHOD FOR MANUFACTURING SAME

(75) Inventors: Stephane Getin, Grenoble (FR); Pierre Ferret, Grenoble (FR); Sergio Nicoletti, Sinard (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 411 days.

(21) Appl. No.: 12/883,525

(22) Filed: Sep. 16, 2010

(65) Prior Publication Data

US 2011/0063416 A1  Mar. 17, 2011

(30) Foreign Application Priority Data

Sep. 17, 2009  (FR) ...................................... 09 56383

(51) Int. Cl.
  *H04N 5/225*  (2006.01)
  *H04N 9/07*  (2006.01)
(52) U.S. Cl. ........................... 348/46; 348/340; 348/335
(58) Field of Classification Search .................... None
  See application file for complete search history.

(56) References Cited

U.S. PATENT DOCUMENTS

| | | | |
|---|---|---|---|
| 6,724,425 B1 * | 4/2004 | Moon et al. ................. | 348/272 |
| 6,909,554 B2 * | 6/2005 | Liu et al. ..................... | 359/626 |
| 7,250,973 B2 * | 7/2007 | Dobashi et al. .............. | 348/340 |
| 7,538,363 B2 * | 5/2009 | Nakagawa et al. .......... | 257/184 |
| 2007/0182821 A1 * | 8/2007 | Adamo et al. ............. | 348/207.99 |
| 2007/0272829 A1 | 11/2007 | Nakagawa et al. | |

FOREIGN PATENT DOCUMENTS

| | | |
|---|---|---|
| EP | 1 339 225 A2 | 8/2003 |
| EP | 1 339 225 A3 | 8/2003 |
| JP | 2001-237405 | 8/2001 |
| JP | 2004-335856 | 11/2004 |

OTHER PUBLICATIONS

French Search Report issued Feb. 17, 2010, in FA 726511 FR 0956383.

* cited by examiner

*Primary Examiner* — Gims Philippe
*Assistant Examiner* — Reza Aghevli
(74) *Attorney, Agent, or Firm* — Oblon, Spivak, McClelland, Maier & Neustadt, L.L.P.

(57) ABSTRACT

A 3D imaging device is comprised of a photodetector matrix, a layer of material fixed on a face of the photodetector matrix, the layer of material being capable of absorbing or reflecting light, an opening being formed in said layer of material at each photodetector, a layer of insulating material fixed on said layer of material capable of reflecting or absorbing light, the layer of insulating material having a face surrounding, in the body thereof, a set of G waveguides, each waveguide of the set of waveguides being positioned vertically in relation to said face, opposite an opening, the heights of the different waveguides, considered in relation to the face of the layer of insulating material, defining N distinct levels, N being a whole number greater than or equal to 2.

10 Claims, 4 Drawing Sheets

3D IMAGING DEVICE AND METHOD FOR MANUFACTURING SAME

TECHNICAL FIELD AND BACKGROUND OF THE INVENTION

The invention concerns a 3D (three dimensional) imaging device, as well as a method for manufacturing a 3D imaging device.

The invention also concerns a 3D imaging system that comprises an element capable of forming a volume image of a three-dimensional object and a 3D imaging device according to the invention.

The invention is applicable in many fields, such as, for instance, cinema and television equipment, devices for photography, remote monitoring, telemeasuring, biological and medical imaging, etc.

Several methods are known from the prior art for conducting 3D imaging.

The best known of these methods is stereoscopy. Stereoscopy is based on the use of two identical imaging systems slightly staggered in space, each imaging system delivering an image of the observed scene. The 3D image is then built from the two images delivered by the imaging systems. The drawback of stereoscopy is the need to use two sensors. The two sensors in fact make up a bulky assembly, the respective positions of which are delicate to calibrate.

To offset the drawback of using two sensors, one known method, autostereoscopy, consists of producing a 3D image using a single sensor made up of a matrix of detectors equipped with microlenses, the matrix of detectors equipped with microlenses itself being completely covered by a lens placed in a support. The drawback of such a sensor lies in the delicate assembly of the different elements that make it up.

Another method is based on the use of lens depth of field. The principle of the method consists of varying the position of the image plane of a lens in order to resolve an object to be studied in depth. To that end, one moves the lens and recomposes the different image planes of the object. One drawback of this method is that it is very complex to implement.

The 3D imaging device according to the invention does not have the aforementioned drawbacks of the prior art.

DESCRIPTION OF THE INVENTION

Indeed, the invention concerns a 3D imaging device comprising a photodetector matrix, characterized in that it comprises:

a first layer of material fixed on a face of the photodetector matrix, the first layer of material being capable of reflecting or absorbing a light incident upon any one of its faces, an opening being formed in the first layer of material at each photodetector, and a second layer of material, made of an electrically insulating material, having a first face fixed on the first layer of material, the second layer of material surrounding, in the body thereof, a set of G waveguides, G being a whole number greater than or equal to 2, each waveguide of the set of G waveguides having a first end substantially flush with the first face of the second layer of material and being positioned substantially facing an opening and a second end substantially flush with a second face of the second layer of material opposite the first face, each second end forming a sensor element for a light incident upon the second face of the second layer of material, the distances that separate the first ends from the second ends of N distinct waveguides, N being a whole number greater than or equal to 2 and less than or equal to G, being different from each other.

"Layer of material capable of reflecting or absorbing a light on any one of its faces" refers to a layer of material that blocks, by reflection and/or absorption, the transmission of a light incident upon any one of its faces.

"Second end forming a sensor element for a light incident upon the second face of the second layer of material" means that the second end of a waveguide constitutes the inlet of a guide by which the fraction of incident light is coupled in the guide.

According to the preferred embodiment of the invention, the waveguides are nanowires formed by growth from metal contacts. The invention does, however, concern other types of waveguides formed using other techniques known in microelectronics, such as, for example ion exchange or etching of a layer filled with a material whereof the refractive index is greater than that of the layer (for example using a method of the CVD, or chemical vapor deposition, type).

According to yet another additional feature of the invention, the G waveguides are distributed above the face of the photodetector matrix such that Nd waveguides of at least one set of Nd waveguides respectively situated opposite Nd openings formed at Nd neighboring photodetectors forming an elementary sub-matrix of P lines and Q columns, P and Q being whole numbers greater than or equal to 2 (P×Q=Nd), Nd being a whole number greater than or equal to N, have N distinct heights in relation to the first face of the second layer of material.

According to yet another additional feature of the invention, when the photodetector matrix comprises several distinct assemblies of Nd wave guides, the Nd waveguides of each set of Nd waveguides are distributed according to a pattern identical from one set of Nd waveguides to the other.

The invention also concerns a method for manufacturing a 3D imaging device, characterized in that it comprises:

a step for forming a first structure made up of a photodetector matrix on one face of which a first layer of material is deposited capable of reflecting or absorbing an incident light on any one of its faces, an opening being formed in the first layer of material at each photodetector, a step for forming a second structure made up of a silicon on insulator type substrate on which nanowires coated with a second layer of electrically insulating material are fixed, the nanowires being distributed on the silicon on insulator type substrate substantially identically to the manner in which the openings formed in the first layer of material of the first structure are distributed and flush with a planar surface of the layer of material, a step for attaching the second structure on the first structure such that the ends of the nanowires that are flush with the planar face of the second layer of material are placed opposite said openings, and a step for etching the silicon on insulator type substrate and the layer of material in which the nanowires are coated to, firstly, eliminate the silicon on insulator type substrate, then to form N distinct levels of the second layer of material with which the nanowires are coated, the N distinct levels making it possible to define, respectively, N distinct nanowires having heights different from each other, N being a whole number greater than or equal to 2.

According to one additional feature of the method according to the invention, the step for forming the first structure comprises:

a step for depositing, on the face of the photodetector matrix, the first layer of material, and a step for etching the first layer of material to form the openings made at the photodetectors.

According to yet another additional feature of the invention, the step for forming the second structure comprises:
- a step for depositing, on the silicon on insulator type substrate, a metal layer,
- a step for etching the metal layer to form a set of metal contacts distributed, on the silicon on insulator type assembly, substantially identically to the manner in which the openings are distributed on the photodetector matrix,
- a step for nanowire growth from the metal contacts,
- a step for depositing the second layer of material on the silicon on insulator type substrate so as to coat all of the nanowires, and
- a step for planarizing the second layer of material to eliminate the metal contacts and make the surface of the second layer planar such that the nanowires are flush with said surface.

The invention also concerns a 3D imaging system comprising an element capable of forming a volume image of a three-dimensional object, characterized in that it also comprises a 3D imaging device according to the invention that is placed at the volume image.

BRIEF DESCRIPTION OF THE DRAWINGS

Other features and advantages of the invention will appear in light of the following description, done in reference to the attached figures, in which.

In all of the figures, same references designate same elements.

DETAILED DESCRIPTION OF EMBODIMENTS OF THE INVENTION

FIGS. 1-7 illustrate the successive steps of a method for manufacturing a 3D imaging device according to the preferred embodiment of the invention for which the waveguides are nanowires.

Figure 1:
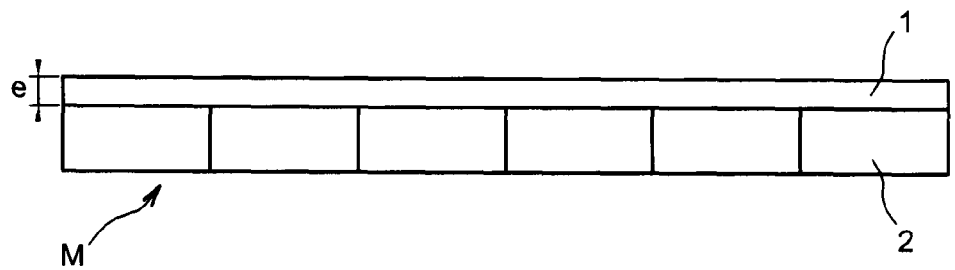
FIGS. 1-7 illustrate successive steps of the method for manufacturing a 3D imaging device according to the preferred embodiment of the invention.

FIG. 1 illustrates a first step of the method for manufacturing the 3D imaging device according to the preferred embodiment of the invention.

The first step of the manufacturing method consists of depositing a layer 1 of material capable of reflecting or absorbing an incident light, for example a layer of aluminum, on a matrix M of photodetectors 2. The photodetectors 2 are, for example, PN junctions formed in silicon, charge couple devices (CCD), bolometers, etc. The thickness e of the layer 1 is, for example, equal to 100 nm.

Figure 2:
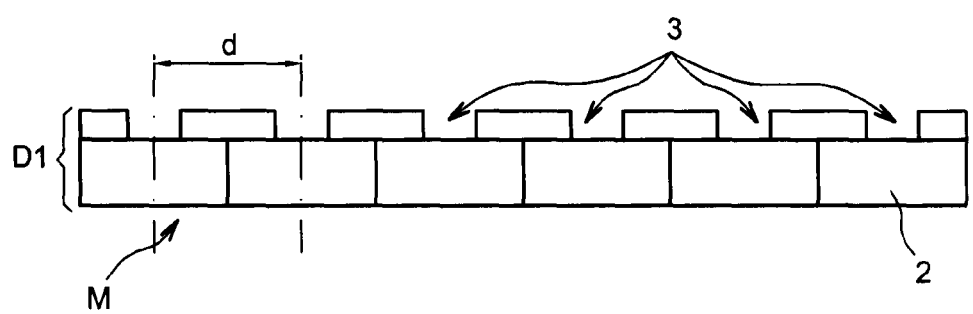

The layer 1 is then etched, in a manner known in itself, to form, above each photodetector 2, an opening 3 whereof the dimensions are, for example, equal to 150 nm×150 nm (cf. FIG. 2). A distance d, for example equal to 5 μm, separates the two openings formed above two neighboring photodetectors. A first device D1 is then formed.

Figure 3:
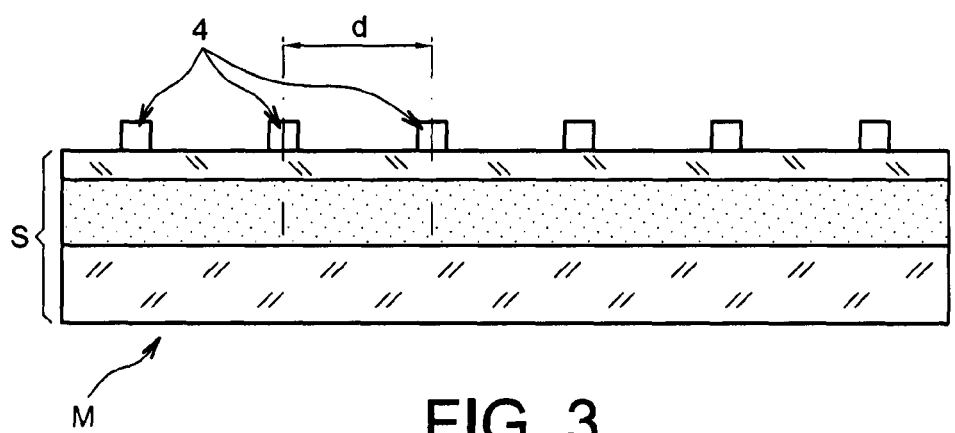

A third step consists of forming a set of metal contacts on a silicon on insulator type substrate, more commonly called SOI substrate. FIG. 3 illustrates this third step. A metal layer, for example a layer of gold, is deposited on a SOI substrate S formed by the superposition of a silicon Si substrate, an insulating layer of $SiO_2$ and a thin layer of silicon Si. The metal layer is then etched, in a manner known in itself, to form contacts 4. The contacts 4 are distributed on the surface of the SOI substrate substantially identically to the manner in which the openings 3 formed in the layer of aluminum are distributed in the preceding step 2. Thus, two neighboring contacts 4 are separated, from axis to axis (cf. FIG. 3), by a distance substantially equal to the distance d that separates, from axis to axis, two neighboring openings 3 (cf. FIG. 2). The transverse section of a contact 4 is chosen to fit into the surface of an opening. Thus, for openings 3 with dimensions 150 nm×150 nm, the transverse section of a contact 4 is, for example, equal to 100 nm.

Figure 4:
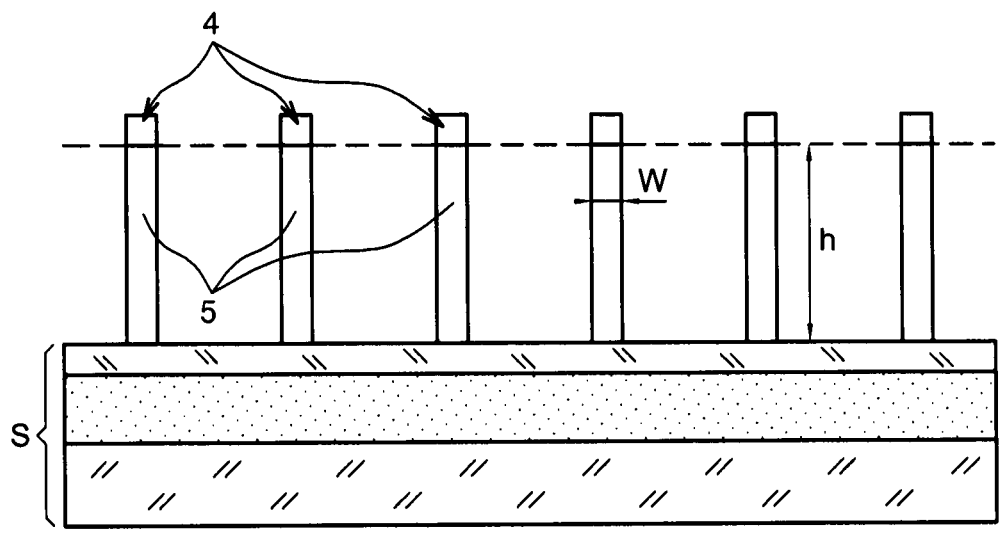

A step for nanowire growth follows the formation of the contacts 4 on the SOI substrate. The nanowire growth step is carried out, in a manner known in itself, using a VLS (Vapor Liquid Solid) method. FIG. 4 illustrates the result of the nanowire growth step. The height h of the nanowires 5 is preferably between 100 nm and 100 μm (for example, 50 μm), and their diameter W is preferably between 50 nm and 3 μm. The material that makes up the nanowires is, for example, zinc oxide (ZnO), or silicon (Si), or Gallium nitride (GaN), etc.

Figure 5:
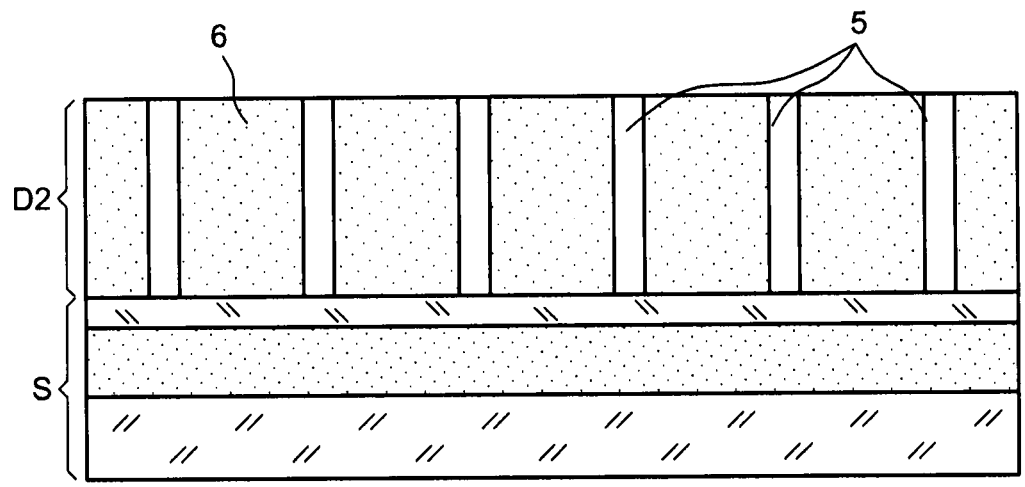

Once the nanowires are produced, a layer 6 of electrically insulating material, for example a layer of $SiO_2$, is deposited on the silicon layer of the SOI substrate (cf. FIG. 5). The layer 6 is characterized by its low absorption in the wavelengths in which the system operates (typically a dielectric-type material). Low absorption refers to a material whereof the absolute value of the imaginary part of the refractive index is less than 0.01.

The nanowires 5 are then coated with the layer of electrically insulating material 6. A chemical mechanical polishing, or planarization, is done on the layer 6 so as to remove the contacts 4 and make the surface of the layer planar. The ends of the nanowires are then flush with the surface of the layer 6. A second device D2 is thus formed.

Figure 6:
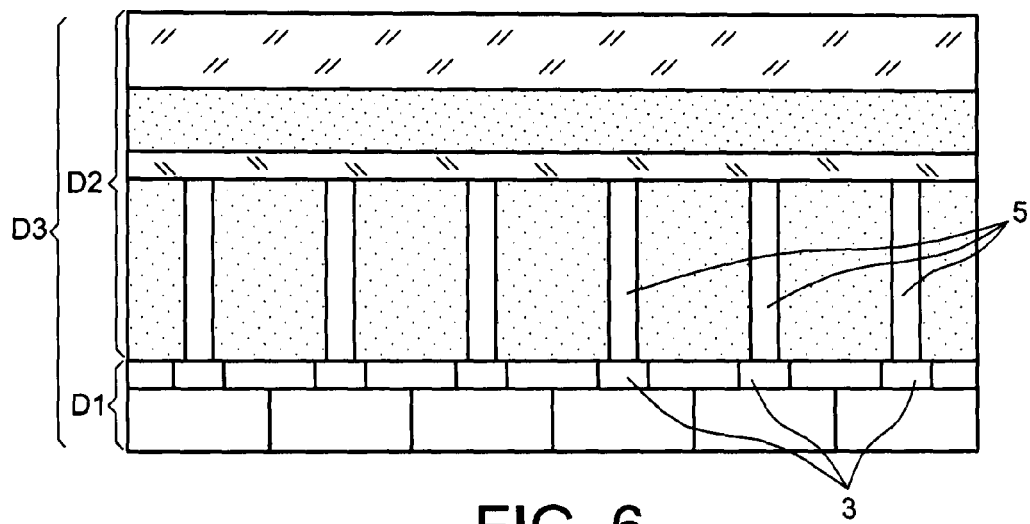
Figure 7:
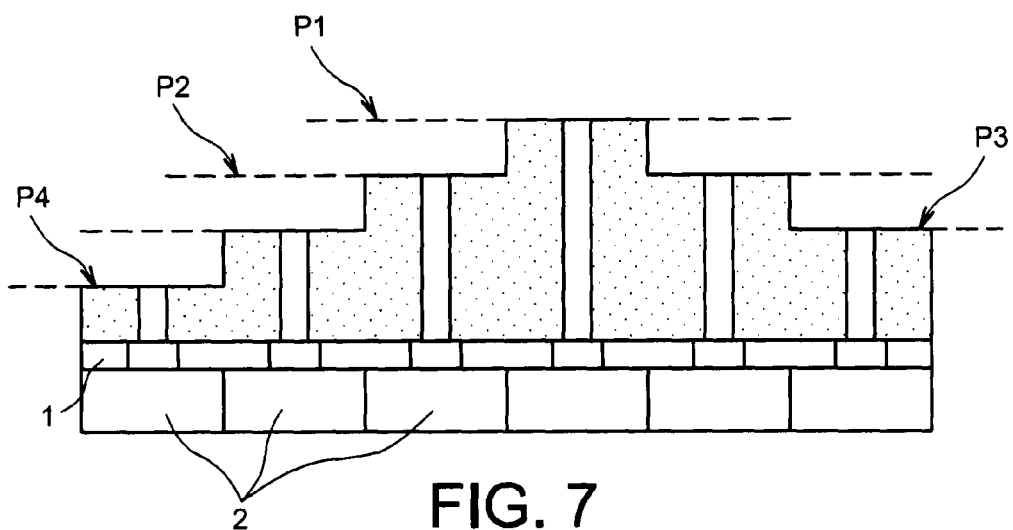

The two devices D1 and D2 obtained at the end of the steps described above (cf. the device illustrated in FIG. 2 and the device illustrated in FIG. 5) are then assembled such that the ends of the nanowires 5 that are flush with the surface of the layer 6 are placed opposite openings 3, a nanowire 5 being substantially centered in relation to an opening 3 (cf. FIG. 6). The assembly of the devices D1 and D2 is done in a manner known in itself, for example using a glue transparent at the wavelength used. The device D3 that results from the assembly of the devices D1 and D2 is then etched. During this etching, the SOI substrate is removed and the block formed by the nanowires 5 and the insulating layer 6 that coats the nanowires is etched on N distinct levels, N being a whole number preferably between 10 and 20 (the whole number N being able, however, to assume any other value between 2 and 10 or greater than 20, as needed). In FIG. 7, for example, there are 4 levels. The N levels may or may not be uniformly distributed between the first level (row 1 level) and the $N^{th}$ level (row N level). The N levels of the insulating layer 6 thus form N distinct sensing levels for a light incident upon the insulating layer 6. The N levels can be distributed, for example, over a depth equal to 500 μm. As a non-limiting example in reference to FIG. 7, four parallel planes P1, P2, P3, P4 represent four distinct sensing levels.

In a first embodiment of the invention, the height of the different levels (i.e. the height of the nanowires) is distributed randomly. The mask used for etching of the 3D device is then designed to that end.

In a second embodiment of the invention, the photodetectors are grouped together by blocks of photodetectors or elementary sub-matrices. An elementary sub-matrix then comprises Nd photodetectors distributed over P lines and Q columns, P and Q being whole numbers greater than or equal to 2 (P×Q=Nd), Nd being a number greater than or equal to N. The heights of the Nd nanowires associated with the Nd photodetectors of each elementary sub-matrix then define the N distinct parallel detection planes.

Figure 8:
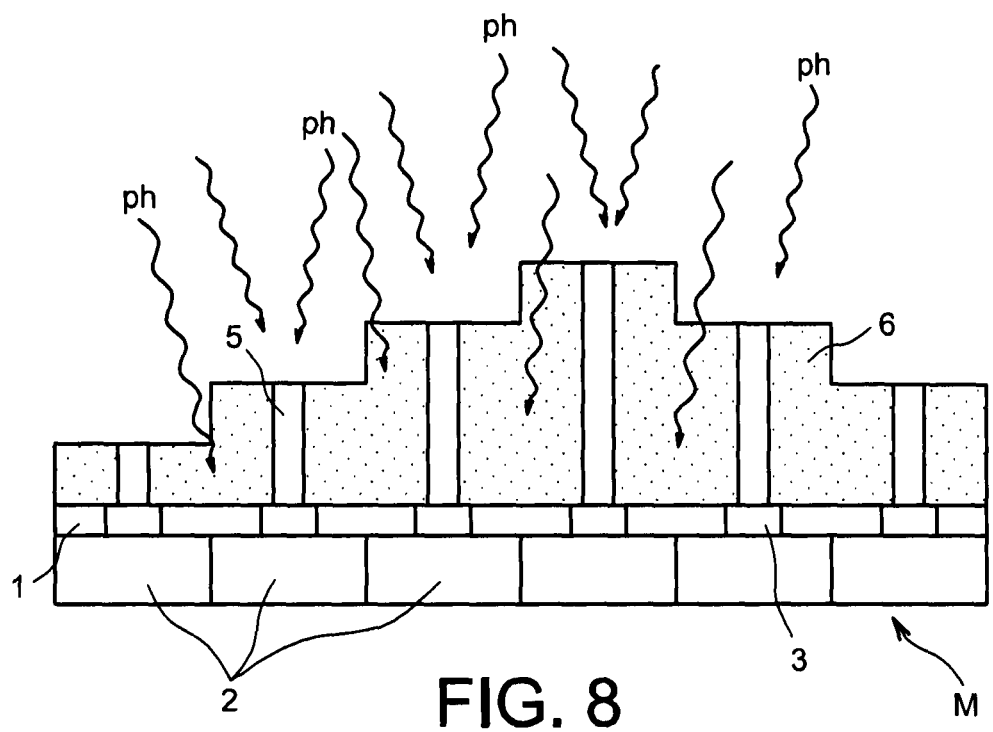
FIG. 8 illustrates an operation of the 3D imaging device according to the invention.

FIG. 8 illustrates an operation of the imaging device illustrated in FIG. 7. An elementary detector of the imaging device is formed by a photodetector 2 and the nanowire 5 situated directly above the photodetector 2. The layer 1 of material capable of reflecting or absorbing the light prevents said light from directly reaching the photodetectors. Each end of a nanowire 5 that is flush with the surface of the layer of insulating material 6 is a sensing element for a fraction of the light incident upon the layer 6. Each nanowire 5 thus constitutes a waveguide in which the light that is collected propagates. The photons ph that reach a photodetector 2 are then only those that propagate in the nanowire 5 situated directly above the photodetector 2. The length of a waveguide (i.e. the height of a nanowire) determines a plane in which a fraction of the image is cut.

Before using the imaging device, a calibration step, during which an image of an object of known dimensions placed at a known distance from the imaging device is formed, advantageously makes it possible to determine the depth that can be detected, photodetector by photodetector, by the imaging device according to the invention. The results of the calibration can advantageously be stored and used later to determine the position of any object whatsoever that is imaged. It has been observed that, owing to the nanowires, the imaging device of the invention is very selective for separating the image planes.

Figure 9:
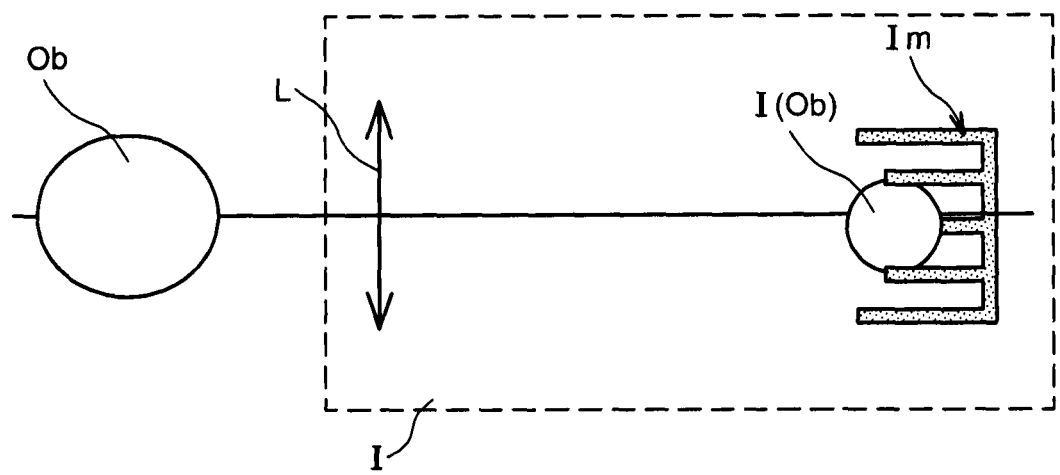
FIG. 9 illustrates an example of a 3D imaging system according to the invention.

FIG. 9 illustrates a 3D imaging system according to the invention. The imaging system I comprises an element L capable of forming an image I(Ob) of an object Ob and an imaging device Im according to the device of the invention. The element L is, for example, a lens. The image I(Ob) is formed at the imaging device Im according to different object planes.

The invention claimed is:

1. An imaging device comprising a photo-detector matrix, characterized in that it comprises:
   a first layer of material fixed on a face of the photo-detector matrix, the first layer of material being capable of reflecting or absorbing a light incident upon any one of its faces, an opening being formed in the first layer of material at each photo-detector;
   a second layer of material, made of an electrically insulating material, having a first face fixed on the first layer of material, the second layer of material surrounding, in the body thereof, a set of G waveguides, G being a whole number greater than or equal to 2, each waveguide of the set of G waveguides having a first end substantially flush with the first face of the second layer of material and being positioned substantially facing an opening and a second end substantially flush with a second face of the second layer of material opposite the first face, each second end forming a sensor element for a light incident upon the second face of the second layer of material, the distances that separate the first ends from the second ends of N distinct waveguides, N being a whole number greater than or equal to 2 and less than or equal to G, being different from each other; and the device is a 3D imaging device.

2. The 3D imaging device according to claim 1, wherein the waveguides are nanowires.

3. The 3D imaging device according to claim 1, wherein the G waveguides are distributed above the face of the photo-detector matrix such that Nd waveguides of at least one set of Nd waveguides respectively situated opposite Nd openings formed at Nd neighboring photo-detectors forming an elementary sub-matrix of P lines and Q columns, P and Q being whole numbers greater than or equal to 2 and Nd=P×Q, Nd being a whole number greater than or equal to N, have N distinct heights in relation to the first face of the second layer of material.

4. The 3D imaging device according to claim 3 and comprising at least two distinct assemblies of Nd waveguides, wherein the Nd waveguides of each set of Nd waveguides are distributed according to a pattern identical from one set of Nd waveguides to the other.

5. The 3D imaging device according to claim 1, wherein the first layer of material is a metal layer that reflects light.

6. A method for manufacturing an imaging device, characterized in that it comprises:
   a step for forming a first structure made up of a photo-detector matrix on one face of which a first layer of material is deposited capable of reflecting or absorbing an incident light on any one of its faces, an opening being formed in the first layer of material at each photo-detector;
   a step for forming a second structure made up of a silicon-on-insulator type substrate on which nanowires coated with a second layer of electrically insulating material are fixed, the nanowires being distributed on the silicon-on-insulator type substrate substantially identically to the manner in which the openings formed in the first layer of material are distributed and flush with a planar surface of the layer of material;
   a step for attaching the second structure on the first structure such that the ends of the nanowires that are flush with the planar face of the second layer of material are placed opposite said openings;
   a step for etching the silicon-on-insulator type substrate and the layer of material in which the nanowires are coated to, firstly, eliminate the silicon-on-insulator type substrate, then to form N distinct levels of the second layer of material with which the nanowires are coated, the N distinct levels making it possible to define, respectively, N different nanowires having heights different from each other, N being a whole number greater than or equal to 2; and the device is a 3D imaging device.

7. The method for manufacturing the 3D imaging device according to claim 6, wherein the step of forming the first structure comprises:
   a step for depositing, on the face of the 30 photo-detector matrix (M), the first layer of material; and
   a step for etching the first layer of material to form the openings (3) made at the photo-detectors.

8. The method for manufacturing the 3D imaging device according to claim 6, wherein the step for forming the second structure comprises:
   a step for depositing, on the silicon-on-insulator type substrate, a metal layer;
   a step for etching the metal layer to form a set of metal contacts distributed, on the silicon-on-insulator type assembly, substantially identically to the manner in which the openings are distributed on the photo-detector matrix;
   a step for nanowire growth from the metal contacts;

a step for depositing the second layer of material on the silicon-on-insulator type substrate so as to coat all of the nanowires; and a step for planarizing the second layer of material to eliminate the metal contacts and make the surface of the second layer planar such that the nanowires are flush with said surface.

9. An imaging system comprising: an element capable of forming a volume image of a three-dimensional object, characterized in that it also comprises a 3D imaging device according to claim 1 that is placed at the volume image.

10. The 3D imaging system according to claim 9, wherein the element capable of forming a volume image of a three-dimensional object is a lens.

* * * * *